US008174336B2

(12) United States Patent
Kim et al.

(10) Patent No.: US 8,174,336 B2
(45) Date of Patent: May 8, 2012

(54) ULTRA-WIDEBAND BALUN AND APPLICATION MODULE THEREOF

(75) Inventors: Young Gon Kim, Busan (KR); Hyun Park, Gyeongsangbuk-do (KR)

(73) Assignee: EM-Wise Communications Company, Daegu (KR)

( * ) Notice: Subject to any disclaimer, the term of this patent is extended or adjusted under 35 U.S.C. 154(b) by 245 days.

(21) Appl. No.: 12/444,473

(22) PCT Filed: Mar. 18, 2008

(86) PCT No.: PCT/KR2008/001513

§ 371 (c)(1), (2), (4) Date: Mar. 10, 2010

(87) PCT Pub. No.: WO2008/147038

PCT Pub. Date: Dec. 4, 2008

(65) Prior Publication Data

US 2010/0182096 A1 Jul. 22, 2010

(30) Foreign Application Priority Data

May 30, 2007 (KR) ........................ 10-2007-0052896

(51) Int. Cl.
*H03H 7/42* (2006.01)
*H03H 7/38* (2006.01)

(52) U.S. Cl. ............................................ 333/26; 333/34

(58) Field of Classification Search .................... 333/25, 333/26, 34, 238, 246
See application file for complete search history.

(56) References Cited

U.S. PATENT DOCUMENTS

| | | | | |
|---|---|---|---|---|
| 5,172,082 | A * | 12/1992 | Livingston et al. | 333/26 |
| 6,531,943 | B2 * | 3/2003 | Niu et al. | 336/182 |
| 6,646,518 | B2 * | 11/2003 | Tajima | 333/26 |
| 2002/0196096 | A1 | 12/2002 | Tajima | |
| 2004/0119573 | A1 | 6/2004 | Lee et al. | |

* cited by examiner

*Primary Examiner* — Dean O Takaoka
(74) *Attorney, Agent, or Firm* — The Webb Law Firm

(57) ABSTRACT

A first transmission line is formed on a first surface of a substrate. A first end of the first transmission line is connected to a transmission line of an unbalanced line. A second end is connected to a first transmission line of a balanced line. A second transmission line extends from a first end of the unbalanced line, alongside the first transmission line and spaced therefrom, and is connected to a second of the transmission lines of the balanced line. A ground plane is formed on a second surface of the substrate, extends from a first end of the balanced line, and is formed along the second transmission line to which the ground plane is connected through one or more vias. A width of a portion of the ground plane adjacent to the unbalanced line is greater than a portion thereof adjacent to the balanced line.

10 Claims, 11 Drawing Sheets

ULTRA-WIDEBAND BALUN AND APPLICATION MODULE THEREOF

TECHNICAL FIELD

The present invention relates, in general, to a balun for converting an unbalanced voltage applied from an unbalanced line into a balanced voltage in a balanced line, or vice versa, and application modules thereof, and, more particularly, to a balun for realizing impedance matching and providing the smooth transition of electric field distributions between unbalanced and balanced lines in an ultra-wide frequency band, and application modules thereof.

BACKGROUND ART

A microstrip line is a transmission line having a single signal line on one surface of a dielectric substrate and a single ground plane on the opposite surface of the substrate, and is a representative unbalanced line, which has been most widely used to connect circuits and parts within a unit. Meanwhile, a Coplanar Stripline (hereinafter referred to as a 'CPS line') is a representative balanced line, which has transmission lines formed parallel to each other in the same plane, and is widely used for the feed line of an antenna, a double-balanced mixer, a double-balanced multiplier, etc., which require the input of a balanced signal.

Meanwhile, in order to connect the unbalanced line to the balanced line in various types of RF/microwave circuits, a balun is generally used. The limits of frequency characteristics of the entire system of RF/microwave circuits are typically determined by a balun. However, a balun, which has been developed and used in the prior art as a structure for making a transition from a microstrip line to a CPS line, has the following problems.

Firstly, the operating frequency bandwidth thereof is limited. In the conventional balun, a mode conversion method or a coupling method is used to make a transition from a microstrip line to a CPS line, but the conventional balun has a limitation in that the optimal impedance matching between the microstrip line and the CPS line and the smooth transition of electric field distributions therebetween are not realized, and thus the frequency bandwidth is narrowed.

Secondly, in order to lower the characteristic impedance of a CPS line, a substrate having a high dielectric constant must be used. That is, to reduce the difference between the impedances of a microstrip line and a CPS line, a substrate having a high dielectric constant must typically be used, and thus there is a limitation when a substrate required for the implementation of a balun is selected.

Thirdly, the transition of the electric field distributions between a microstrip line and a CPS line is not smoothly made. That is, in a microstrip line, electric fields are generally distributed to be perpendicular both to a signal line and to a ground plane. In contrast, in a CPS line, electric fields are formed parallel to and between two transmission lines. Therefore, in these electric field distributions, the smooth transition between the two lines is essential, but the structure of the conventional balun cannot satisfactorily realize the smooth transition of electric field distributions.

Fourthly, a conventional ultra-wideband balun, which is used in an ultra-wideband antenna or an ultra-wideband double-balanced mixer, adopts the structure of parallel-plate stripline baluns, which use the top surface and the bottom surface of a dielectric substrate. However, in order to implement an ultra-wideband double-balanced mixer or the like using such parallel-plate stripline baluns, respective ports of diodes must be connected to the top surface and bottom surface of a substrate, so that there is a problem in that it is difficult to mount various elements thereon, and thus the costs required for the implementation of a mixer are increased. Further, in the case of an antenna requiring a balanced signal, one end of the antenna is placed on the top surface of a substrate and the other end thereof is placed on the bottom surface thereof, and thus this structure is not visually attractive, and in addition, the implementation of the antenna is inconvenient.

DISCLOSURE

Accordingly, the present invention has been made keeping in mind the above problems occurring in the prior art, and an objective of the present invention is to provide an ultra-wideband balun, which is arranged between an unbalanced line, such as a microstrip line, and a balanced line, such as a CPS line, and is constructed using parallel lines that include vias and a underneath ground plane with a modified shape obtained with a rule, thus realizing the optimal impedance matching and the smooth transition of electric field distributions between the unbalanced line and the balanced line.

Another objective of the present invention is to design the structure of a balun, which operates in an ultra-wide band, has excellent insertion loss characteristics, and overcomes the limitations of a conventional balun structure in which a substrate having a high dielectric constant must be used, thus enabling an optimal balun to be implemented on a substrate having any dielectric constant.

In accordance with a first aspect of the present invention to accomplish the above objectives, there is provided an ultra-wideband balun connected between an unbalanced line and a balanced line, comprising a first transmission line formed on a first surface of a substrate, and configured such that a first end of the first transmission line is connected to a transmission line of the unbalanced line and a second end thereof is connected to a first one of transmission lines of the balanced line; a second transmission line formed on the first surface of the substrate, and configured such that the second transmission line extends from a first end of the unbalanced line, is arranged alongside of the first transmission line to be spaced apart therefrom by a certain distance, and is connected to a second one of the transmission lines of the balanced line; and a ground plane formed on a second surface of the substrate and configured such that the ground plane extends from a first end of the balanced line, is formed along the second transmission line, and is connected to a ground plane of the unbalanced line, wherein the second transmission line is connected to the ground plane of the balun through one or more vias that are perpendicular to the ground plane of the balun, and the ground plane of the balun is formed such that a width of a portion thereof adjacent to the unbalanced line is greater than that of a portion thereof adjacent to the balanced line.

Preferably, the ground plane of the balun may be formed to have a shape in which a width of the ground plane decreases toward the second transmission line in a direction from the unbalanced line to the balanced line in order to make a smooth transition of electric field distributions between the unbalanced line and the balanced line. Preferably, the ground plane of the balun may be formed to have a taper shape in which the width of the portion thereof adjacent to the unbalanced line is greater than that of the portion thereof adjacent to the balanced line.

Preferably, the ground plane of the balun may be formed such that variation in impedance of the balun conforms to a shape of a Klopfenstein taper.

In accordance with a second aspect of the present invention to accomplish the above objectives, there are provided an ultra-wideband antenna module, wherein the ultra-wideband balun is used as a feeding line and the balanced line is a part of an antenna element requiring an input of a balanced signal, a double-balanced mixer module, wherein the balanced line connected to the balun is connected to an input port or an output port of a double-balanced mixer, an ultra-wideband double-balanced multiplier module, wherein the balanced line connected to the balun is connected to an input port or an output port of a double-balanced multiplier, or an ultra-wideband signal inverter module, wherein two or more baluns are arranged to be connected through a balanced line therebetween.

In accordance with a third aspect of the present invention to accomplish the above objectives, there is provided an ultra-wideband balun structure, comprising: a microstrip line including a first transmission line and a first ground plane on both surfaces of a substrate, respectively; a balun including: a second transmission line which extends from a first end of the microstrip line, wherein the first transmission line continuously extends from the microstrip line on a first surface of the substrate on which the first transmission line of the microstrip line is formed, and wherein the second transmission line is arranged alongside of the first transmission line to be spaced apart therefrom by a certain distance; and a second ground plane which extends from the first end of the ground plane of the microstrip line and is arranged along the second transmission line, wherein the second ground plane is formed on a second surface of the substrate on which the first ground plane is formed; and a Coplanar Strip (CPS) line formed in such a way that the first and second transmission lines of the balun continuously extend from the balun, wherein the second transmission line formed in the balun is connected to the second ground plane through one or more vias that are perpendicular to the second ground plane, and the second ground plane is formed in a taper shape in which a width of a portion thereof adjacent to the microstrip line is greater than that of a portion thereof adjacent to the CPS line.

BEST MODE

Hereinafter, embodiments of the present invention will be described in detail with reference to the attached drawings.

Figure 1:
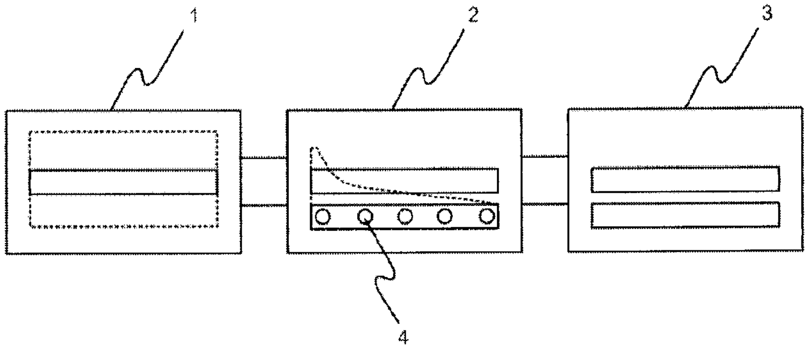
FIG. 1 is a diagram showing the schematic construction of an ultra-wideband balun structure according to an embodiment of the present invention.

FIG. 1 is a diagram showing the schematic construction of an ultra-wideband balun structure according to an embodiment of the present invention.

Referring to FIG. 1, the balun structure according to an embodiment of the present invention adopts a structure in which a balun 2 is arranged between a microstrip line 1, which is an unbalanced line, and a CPS line 3, which is a balanced line. The portion indicated by the dotted line in FIG. 1 denotes a ground plane formed on the bottom surface of a substrate. In the balun 2, one of two parallel transmission lines is connected to the ground plane through vias 4, as will be described later.

Figure 2:
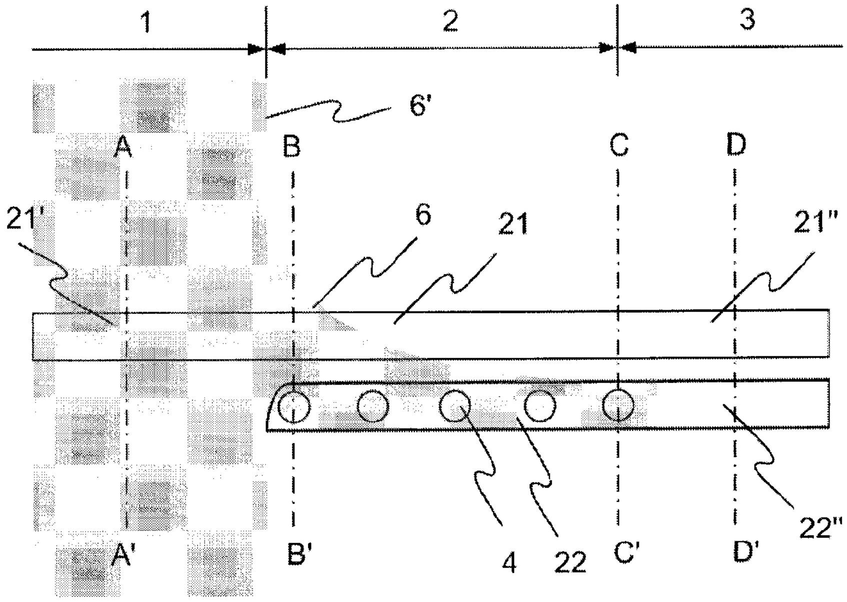
FIG. 2 is a diagram showing the detailed construction of an ultra-wideband balun structure according to an embodiment of the present invention.
Figure 3:
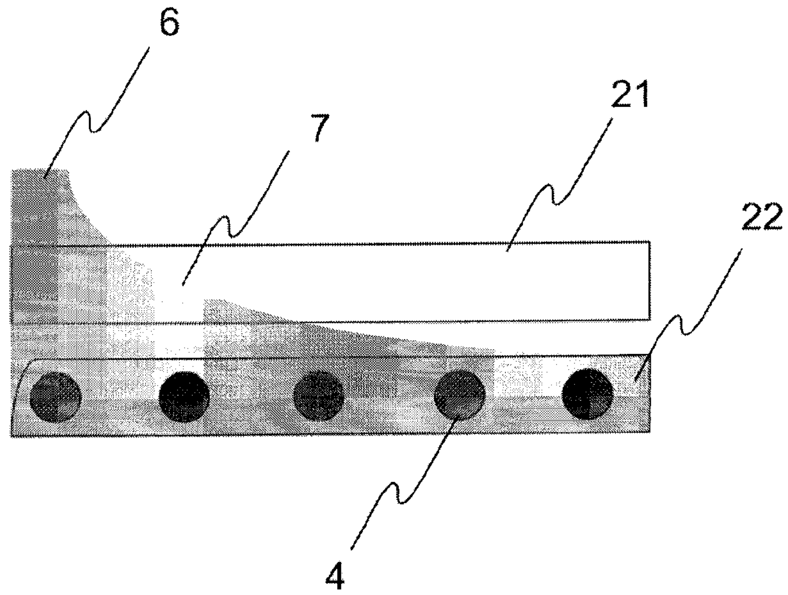
FIG. 3 is a diagram showing the detailed construction of the ground plane and vias of the balun in the ultra-wideband balun structure of FIG. 2.
Figure 4:
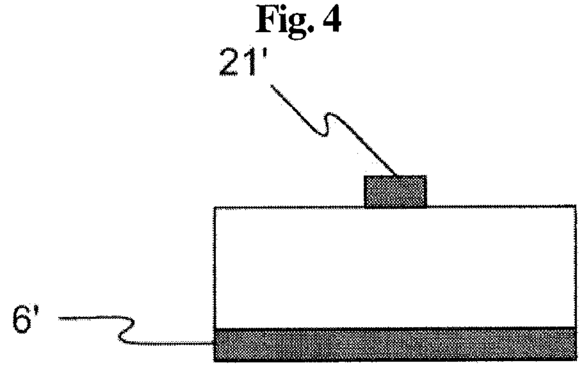
FIGS. 4 to 7 are sectional views respectively taken along lines A'-A, B'-B, C'-C, and D'-D in the ultra-wideband balun structure of FIG. 2.
Figure 5:
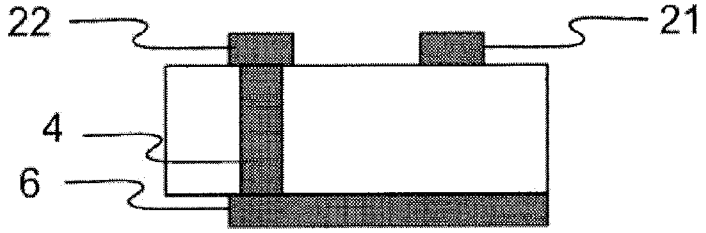
Figure 6:
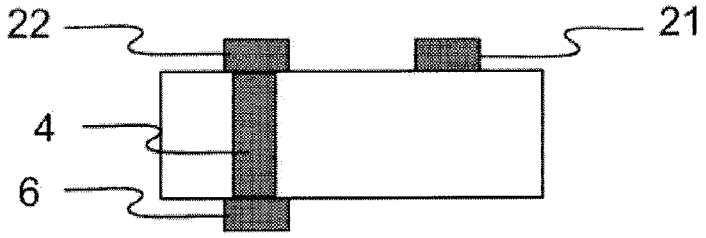
Figure 7:
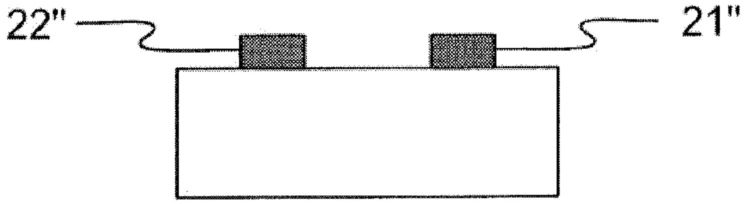

FIG. 2 is a diagram showing the detailed construction of an ultra-wideband balun structure according to an embodiment of the present invention, FIG. 3 is a diagram showing the detailed construction of the ground plane and vias of the balun in the ultra-wideband balun structure of FIG. 2, and FIGS. 4 to 7 are sectional views respectively taken along lines A'-A, B'-B, C'-C, and D'-D in the ultra-wideband balun structure of FIG. 2.

Referring to FIGS. 2 to 7, the balun according to an embodiment of the present invention is configured such that a first transmission line 21 is formed on one surface of a dielectric substrate and is connected both to the transmission line 21' of a microstrip line 1 and to one line 21" of two parallel transmission lines of a CPS line 3, and such that a second transmission line 22 extends from one end of the microstrip line 1 and is connected to the other line 22" of the two parallel transmission lines of the CPS line 3. Further, the second transmission line 22 is constructed such that it is connected through perpendicular vias 4 to a ground plane 6, which is formed on the opposite surface of the dielectric substrate and is indicated by the shaded portion. In consideration of impedance matching with the microstrip line, the ground plane 6 is formed such that it extends from the ground line 6' of the microstrip line 1, is gradually narrowed toward the CPS line 3, and is terminated at the location meeting the CPS line 3. A curve 7, indicating the degree to which the width of the ground plane 6 gradually decreases, preferably conforms to a taper shape in consideration of the smooth transition of electric field distributions and impedance matching between respective transmission lines, as will be described later.

The advantages obtained according to the above construction of the present invention may be described from the standpoint of the smooth transition of electric field distributions and optimal impedance matching between respective transmission lines.

First, an advantage obtained from the standpoint of electric field distribution will be described in detail below with reference to FIGS. 8 to 11, which show electric field distributions on respective sections of FIGS. 4 to 7.

Figure 8:
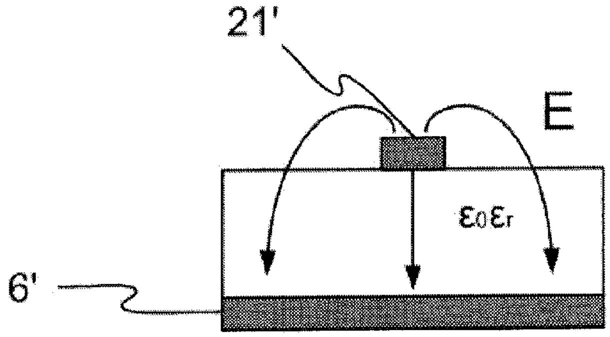
FIGS. 8 to 11 are diagrams showing electric field distributions on respective sections of FIGS. 4 to 7.
Figure 9:
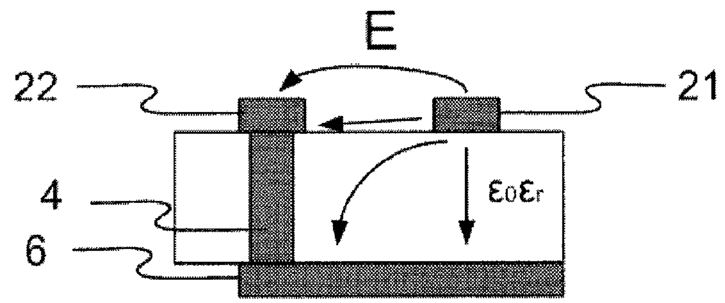
Figure 10:
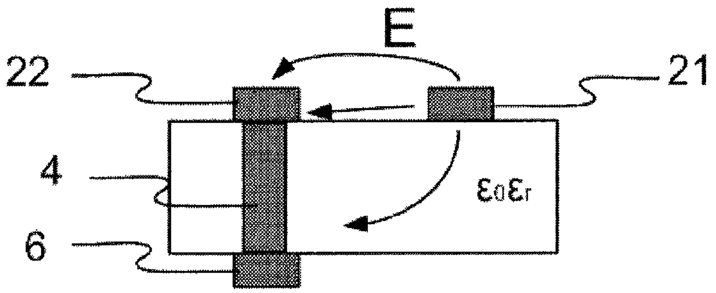
Figure 11:
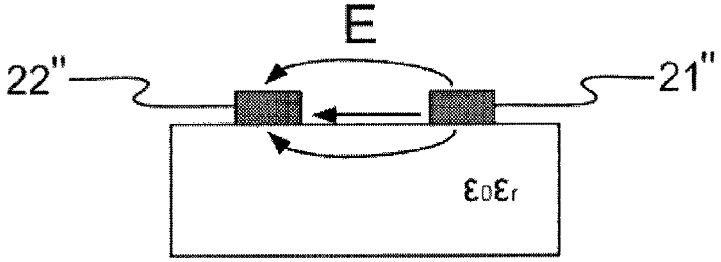

As shown in FIG. 8, showing a section taken along line A'-A of FIG. 2, in a microstrip line 1, which is an unbalanced line, part of electric fields exist outside a dielectric substrate, but most of the electric fields are perpendicularly distributed inside the dielectric substrate. However, from FIG. 9, showing a section taken along line B'-B of FIG. 2, it can be seen that, in the balun 2, the ground plane 6 of which is modified, electric field distributions make a transition so that a horizontal component exists due to the second transmission line 22 in the portion of the balun 2 in which the width of the ground plane 6 is large. Further, as shown in FIG. 10, the perpendicular electric fields decrease while the ground plane 6 connected to the second transmission line 22 gradually decreases toward the second transmission line 22, and thus the electric fields make a transition to the horizontal electric fields. Further, as shown in FIG. 11, in the CPS line, mostly horizontal electric field distributions, which are the typical electric field distributions of the CPS line, are obtained.

Therefore, according to the ultra-wideband balun 2 according to the present invention, the smooth transition of electric field distributions is realized between the microstrip line 1, which is the unbalanced line, in which most electric field distributions are perpendicularly formed, and the CPS line 3, which is the balanced line, in which most electric field distributions are horizontally formed. That is, as the width of the ground plane, connected to the second transmission line 22 through the vias 4, gradually decreases toward the CPS line 3, the electric field distributions make a transition to the horizontal electric field distributions, as in the case of the CPS line 3. In addition, the continuity of a ground plane signal path between the microstrip line 1 and the balun 2 can be guaranteed. In this case, the phase velocity or effective dielectric constant of the parallel lines of the balun 2, which includes vias and the modified ground plane 6, varies when the width of the ground plane 6 varies. Therefore, the balun must be designed in consideration of the phase velocity or the effective dielectric constant in applications in which the phase between transmission lines is important.

Meanwhile, the advantages of the balun according to the present invention, obtained from the standpoint of impedance matching between respective transmission lines, are separately described for the case of a substrate having a low dielectric constant and the case of a substrate having a high dielectric constant.

First, when the dielectric constant ($\epsilon r$) of the dielectric substrate is so low that the relative dielectric constant thereof is about 2 to 4, the characteristic impedance of the CPS line 3 is much greater than that of the microstrip line 1. Therefore, in this case, impedance transformation for optimal impedance matching between the two transmission lines is needed in addition to smooth transition of electric field distributions from the microstrip line 1 into the CPS line 3.

As shown in FIGS. 8 to 11, in the case of the balun of the present invention, it can be seen that, when the width of the ground plane 6 of the balun 2 connected through the via 4 is changed, the characteristic impedance of the transition structure will change. That is, when the width of the ground plane 6 gradually decreases toward the second transmission line 22, in which the via 4 is formed, characteristic impedance will increase. Therefore, on the basis of these characteristics, variation in the width of the ground plane 6 required for the realization of optimal impedance tapering (continuous impedance variation) can be determined.

Figure 12:
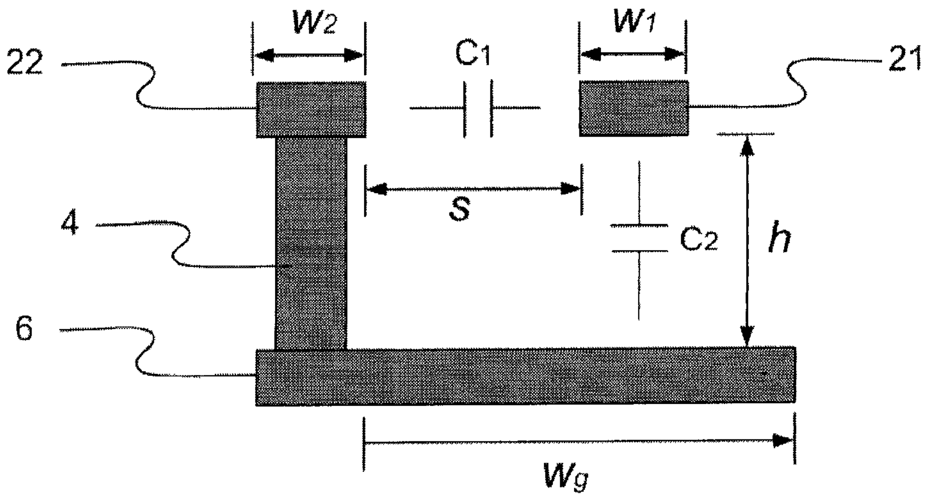
FIG. 12 is a diagram showing an equivalent model of obtaining the characteristic impedance of parallel lines of an ultra-wideband balun according to the present invention.

The principle of the above-described impedance matching will be described in detail below with reference to FIG. 12. FIG. 12 illustrates an equivalent model of obtaining the characteristic impedance of the parallel lines of the balun 2 having a modified ground plane according to the present invention.

As shown in FIG. 12, it is assumed that the capacitance value between the first transmission line 21 and the ground plane 6 is C2, and the capacitance value between the first transmission line 21, having no via 4, and the second transmission line 22, having a via 4, is C1. When the width (Wg) of the ground plane 6, extending from the second transmission line 22 having the via 4, decreases, the capacitance C2 between the first transmission line 21 and the ground plane 6 decreases, and thus the impedance value increases. Further, it can be seen that the total characteristic impedance value of the parallel lines, composed of the first transmission line 21 and the second transmission line 22, can be suitably adjusted by adjusting the capacitance value C1 between the first transmission line 21 and the second transmission line 22. Through this principle, in order to realize impedance matching from the relatively low characteristic impedance of the microstrip line 1 to the relatively high characteristic impedance of the CPS line 3, the width of the ground plane is adjusted, and thus optimal impedance matching can be realized.

Here, in order for the balun of the present invention to operate with a minimum ripple characteristics in an ultra-wide band, the impedance tapering of the ground plane 6 connected to the second transmission line 22 through the via 4 can be implemented using Klopfenstein tapering. In addition to Klopfenstein tapering, the shape of the ground plane can be determined using various types of impedance tapering, such as Hecken tapering, to obtain desired frequency characteristics.

Examples of the implementation of the ultra-wideband balun according to the present invention are described below. When an RT-Duroid 5880 substrate having a relative dielectric constant of 2.2 and a thickness of 10 mil is used, the width of the transmission line of a 50 Ohm-microstrip line is 30 mil. The impedance of the CPS line, which has the same line width as the microstrip line and in which the interval between lines is 5 mil, is 129 Ohm. Therefore, in the case of the balun according to the present invention, the width of the ground plane must be adjusted so that optimal impedance matching between characteristic impedances ranging from 50 Ohm to 129 Ohm is realized. For optimal impedance matching, Klopfenstein tapering was used, and the modification of the width of the ground plane corresponding thereto is shown in FIG. 3.

Meanwhile, in the case of a substrate having a high dielectric constant, the difference between the characteristic impedances of the microstrip line and the CPS line is not large, and thus the modification of the ground plane is for mostly the suitable transition of electric field distributions. That is, when a substrate having a high dielectric constant is used, the modification of the ground plane of parallel lines including vias can be designed, as shown in FIG. 3, similar to a substrate having a low dielectric constant. However, unlike the substrate having a low dielectric constant, the characteristics of the entire balun structure using the substrate having a high dielectric constant are less sensitive to the modified shape of the ground plane than a balun structure using the substrate having a low dielectric constant. Therefore, when only a process for making the smooth transition of electric field distributions is realized between the transmission lines, balun characteristics covering a very wide frequency band can be obtained.

FIGS. 13 to 16 are diagrams showing simulation results and measurement results obtained when the ultra-wideband balun of the present invention is constructed in a back-to-back configuration.

Figure 13:
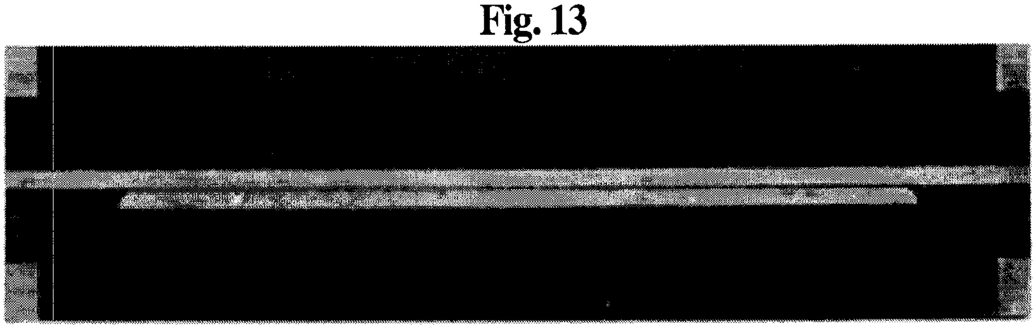
FIGS. 13 to 16 are diagrams showing an embodiment in which the ultra-wideband balun of the present invention is constructed in a back-to-back structure, and the simulation results and measurement results thereof to describe the performance of the ultra-wideband balun according to the present invention.
Figure 14:
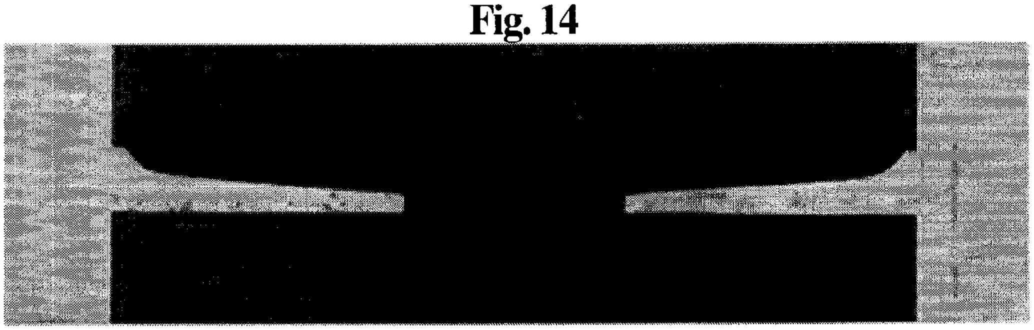
Figure 15:
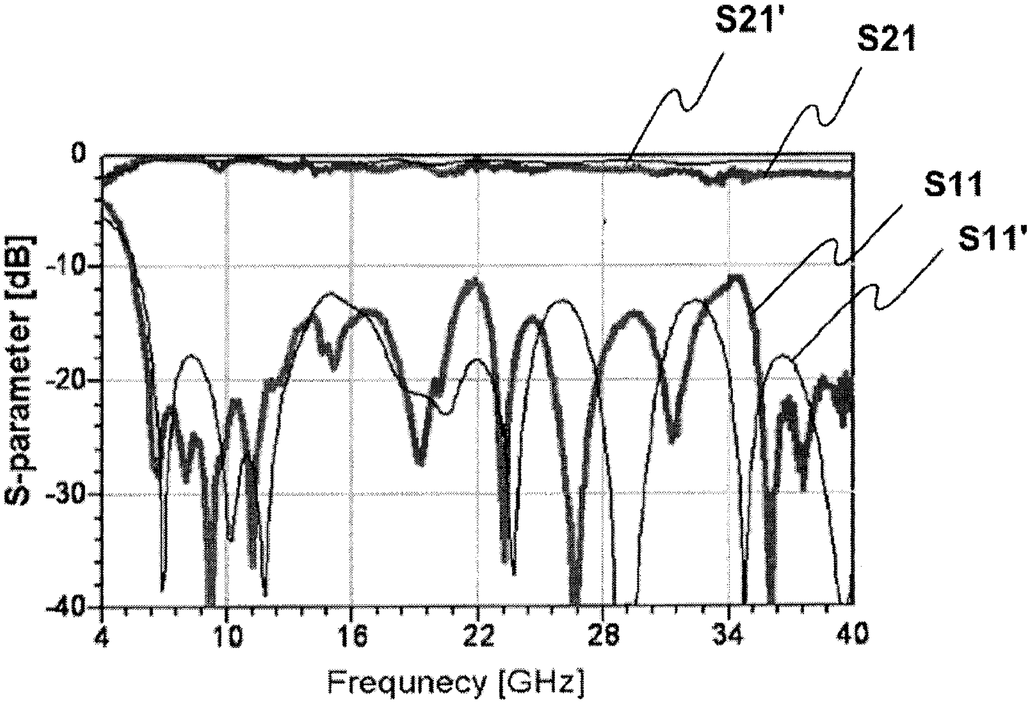
Figure 16:
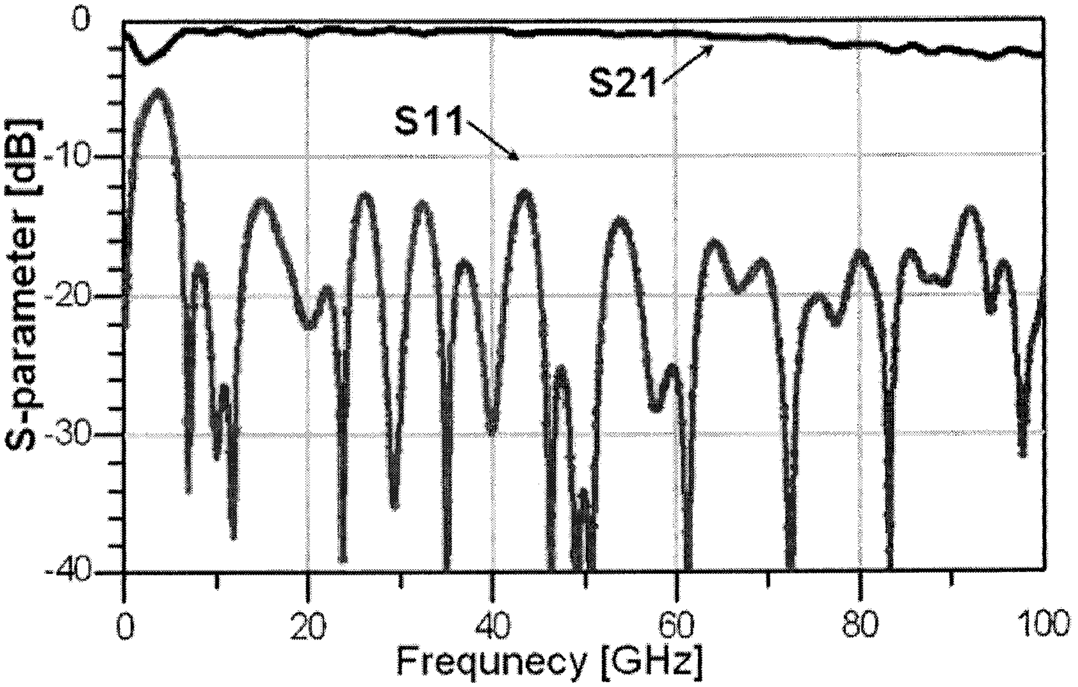

FIG. 13 illustrates the top surface of the back-to-back configuration of the ultra-wideband balun according to the present invention, and FIG. 14 illustrates the bottom surface of the back-to-back configuration of the ultra-wideband balun. FIG. 15 illustrates the comparison of simulation results and measurement results of S-parameters based on the ultra-wideband balun of the present invention, implemented in FIGS. 13 and 14. The bold curves respectively indicate an input reflection coefficient S11 and a forward transfer coefficient S21 as measurement results, and the thin curves respectively indicate an input reflection coefficient S11' and a forward transfer coefficient S21' as simulation results. Further, FIG. 16 illustrates the simulation results of the S-parameters based on the ultra-wideband balun of the present invention, implemented in FIGS. 13 and 14. From FIG. 16, it can be seen that low loss characteristics are exhibited in a pass band, and, in addition, ultra-wideband characteristics covering about 100 GHz are exhibited.

The ultra-wideband balun according to the present invention can be variously applied to, for example, an ultra-wideband antenna, an ultra-wideband double-balanced mixer, an ultra-wideband double-balanced multiplier, an RF/microwave signal inverter, etc.

FIGS. 17 to 20 are diagrams showing examples of an ultra-wideband antenna module in which the ultra-wideband balun of the present invention can be used. In many cases of usage of a planar antenna, an unbalanced port is generally used as the input port of the antenna in consideration of the fact that respective components are mounted on a substrate. Due thereto, when a balanced antenna element, such as a dipole antenna, is employed, a separate balanced-unbalanced conversion module is required.

Figure 17:
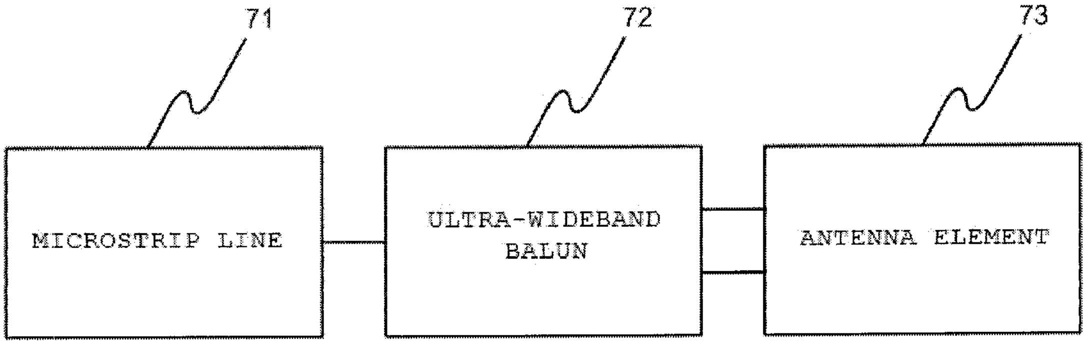
FIGS. 17 to 20 are diagrams showing examples of an ultra-wideband antenna module in which the ultra-wideband balun of the present invention can be used.

FIG. 17 is a diagram showing the construction of an ultra-wideband antenna module in which the ultra-wideband balun of the present invention is used in the feeding part of a balanced antenna. Referring to FIG. 17, the input port of the antenna module is shown as a microstrip line 71, and an ultra-wideband balun 72 according to the present invention functions as a feeding part for an antenna element 73 requiring the input of a balanced signal.

Figure 18:
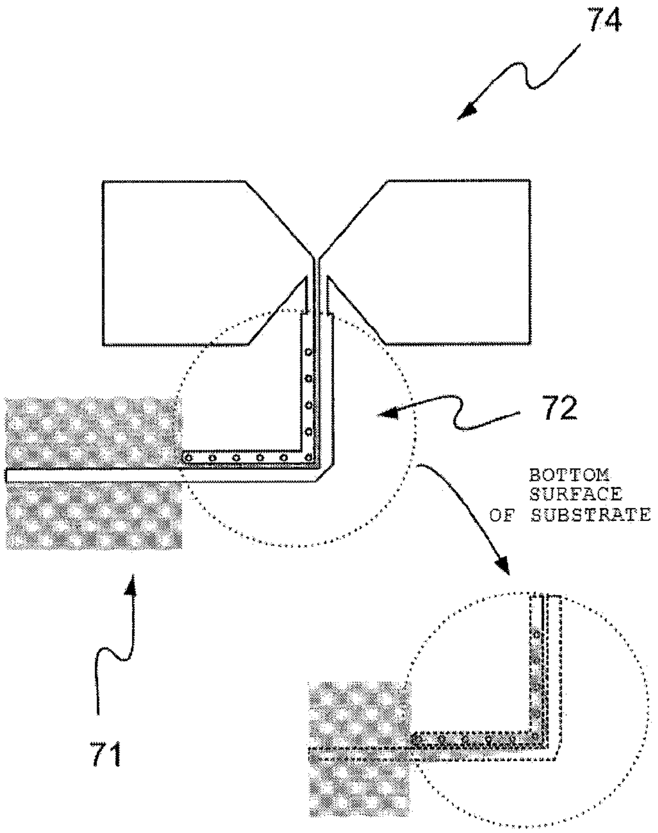
Figure 19:
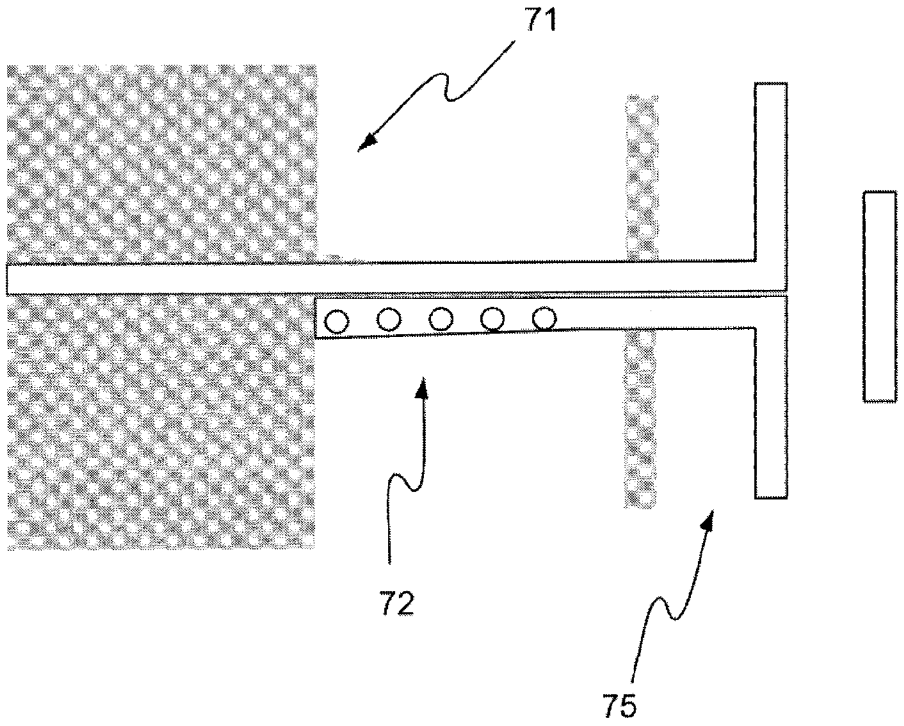
Figure 20:
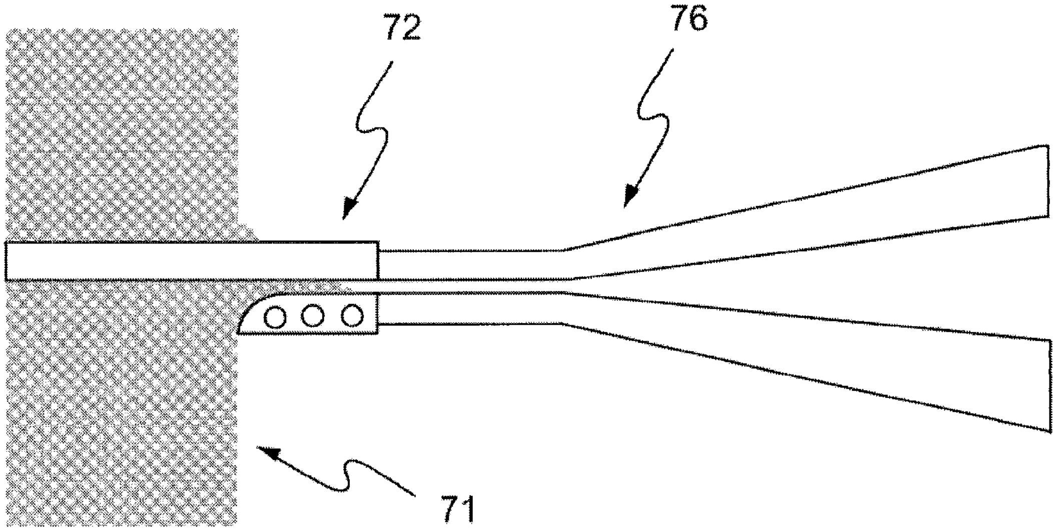

FIGS. 18 to 20 are diagrams showing examples of an ultra-wideband antenna module in which the ultra-wideband balun of the present invention is used. A bow-tie type antenna module 74, a quasi-Yagi antenna module 75, and a tapered-slot antenna module 76, which are representative uniplanar antennas, each requiring the input of balanced signals having a phase difference of 180° therebetween, are respectively illustrated in the drawings. Shaded portions indicate the shapes of a ground plane.

In the case of the antenna module requiring the input of a balanced signal, the limit of a frequency bandwidth is often determined by a balun. When the ultra-wideband balun 72 according to the present invention is used, there are advantages in that the frequency characteristics of the antenna element 73 itself can be obtained without change, and the design process of the antenna is greatly simplified. That is, since the balun used as the feeding part of the antenna has a very wide band, the ultra-wideband balun of the present invention need only be connected to the antenna element after optimizing only the structure of the antenna element, thus greatly reducing the time taken to design the antenna while improving the overall characteristics of a planar antenna, including a feeder part. Further, in the case of the conventional balun, both the top surface and the bottom surface of a substrate must be used due to the configurations of the balun. However, when the ultra-wideband balun of the present invention is used, a balanced line can be used in a single plane, and thus a great advantage can also be obtained from the standpoint of the implementation of an antenna.

FIGS. 21 to 27 are diagrams showing examples of an ultra-wideband double-balanced mixer in which the ultra-wideband balun of the present invention can be used.

Generally, the mixer of an RF system is used for a frequency converter by multiplying two input signals, resulting in a single frequency converted signal, and outputting the resulting signal. An up-conversion mixer used for a transmission Radio Frequency (RF) system multiplies an Intermediate Frequency (IF) signal by a Local Oscillation (LO) signal, and outputs the resulting signal as an RF signal. A down-conversion mixer used for a reception RF system multiplies an RF signal by an LO signal, and outputs the resulting signal as an IF signal.

Figure 21:
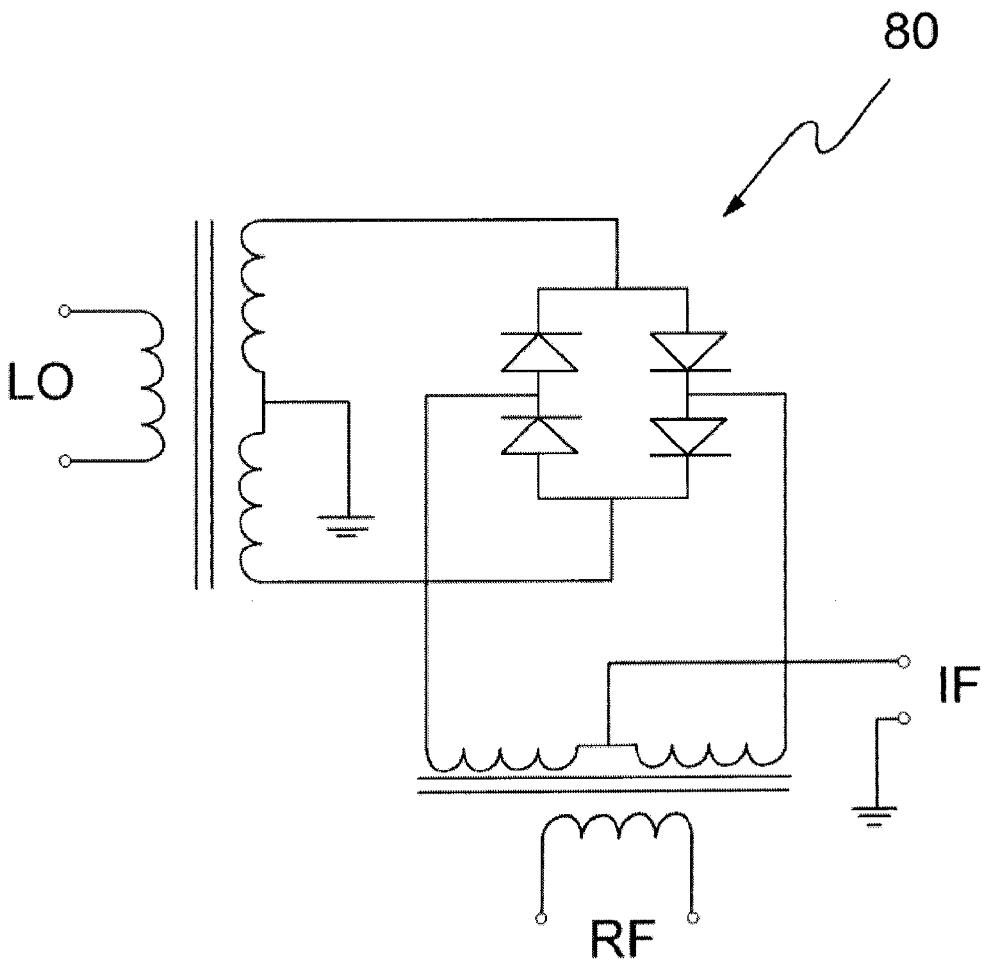
FIGS. 21 to 27 are diagrams showing examples of an ultra-wideband double-balanced mixer in which the ultra-wideband balun of the present invention can be used.

Further, such up-conversion or down-conversion mixers can be classified into an unbalanced mixer for receiving a relevant signal as a single-ended signal, a single-ended balanced mixer for receiving one signal as a differential signal and the other signal as a single-ended signal, and a double-balanced mixer for receiving two signals as differential signals, depending on the input form of an IF signal and an LO signal, or an RF signal and an LO signal. FIG. 21 illustrates a typical structure of a double-balanced mixer.

Figure 22:
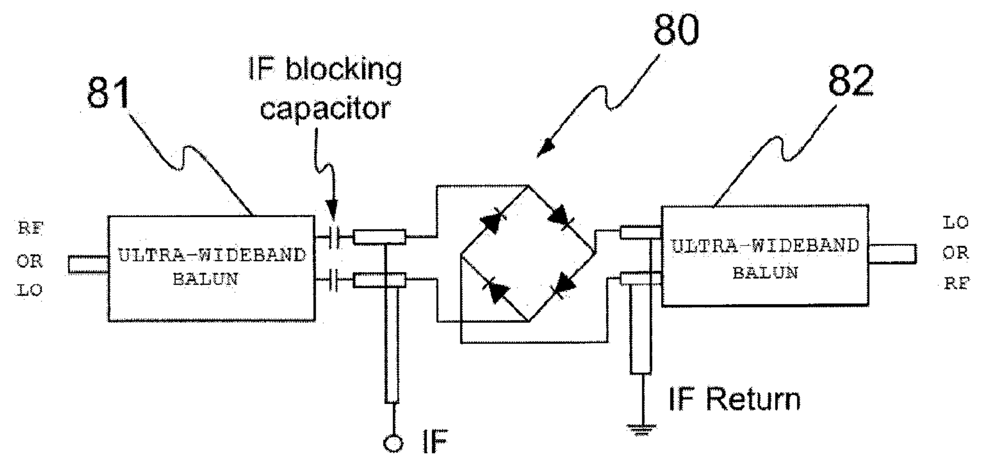
Figure 23:
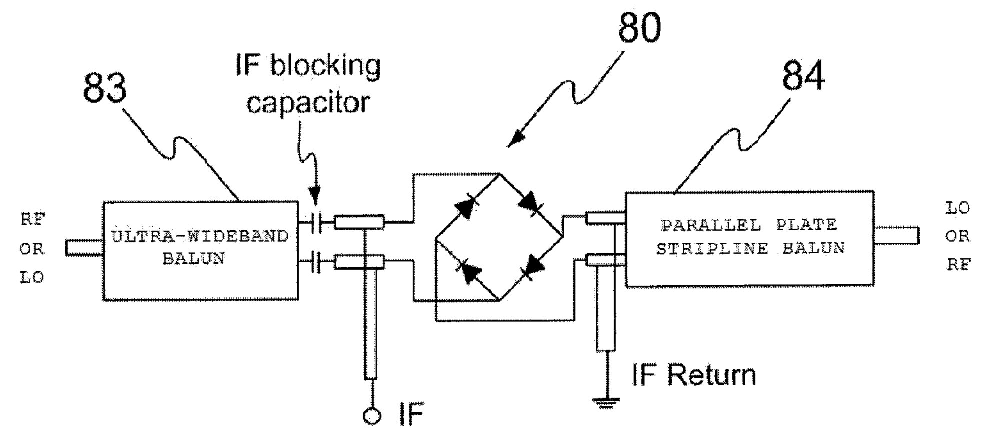
Figure 24:
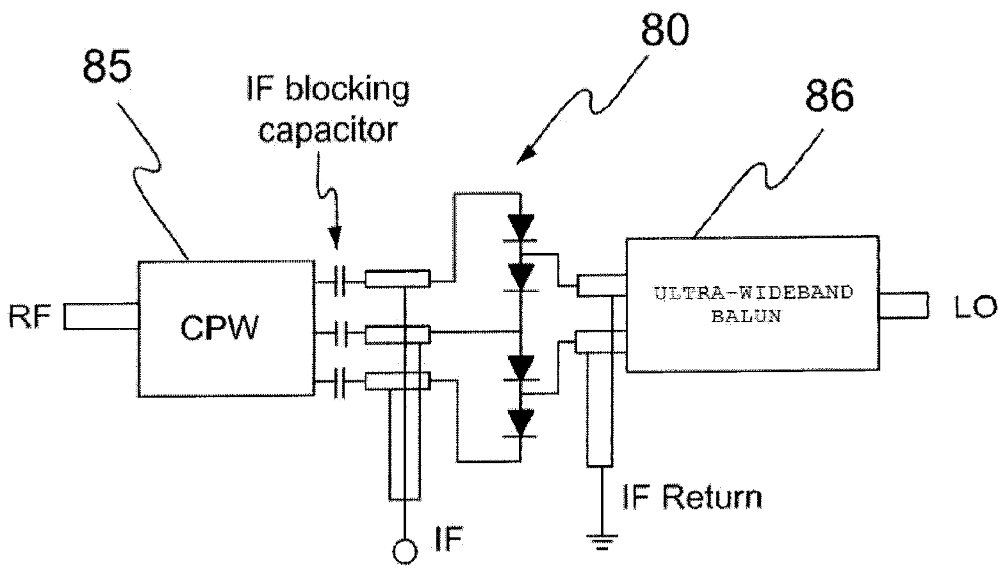
Figure 25:
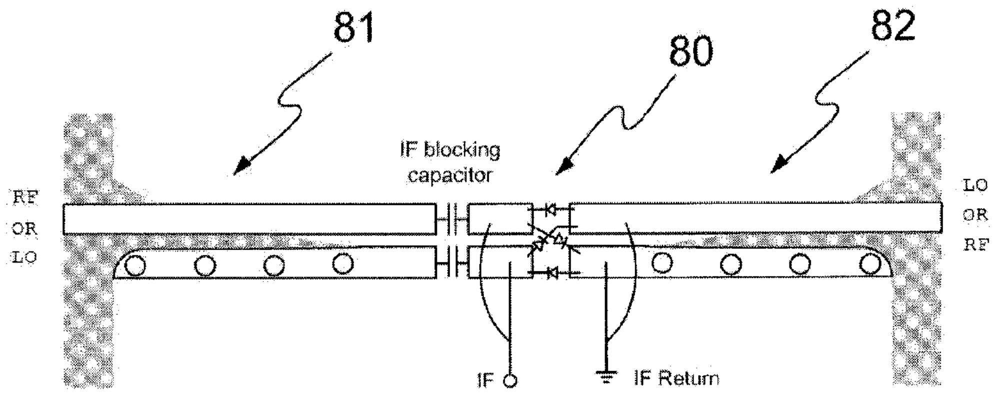
Figure 26:
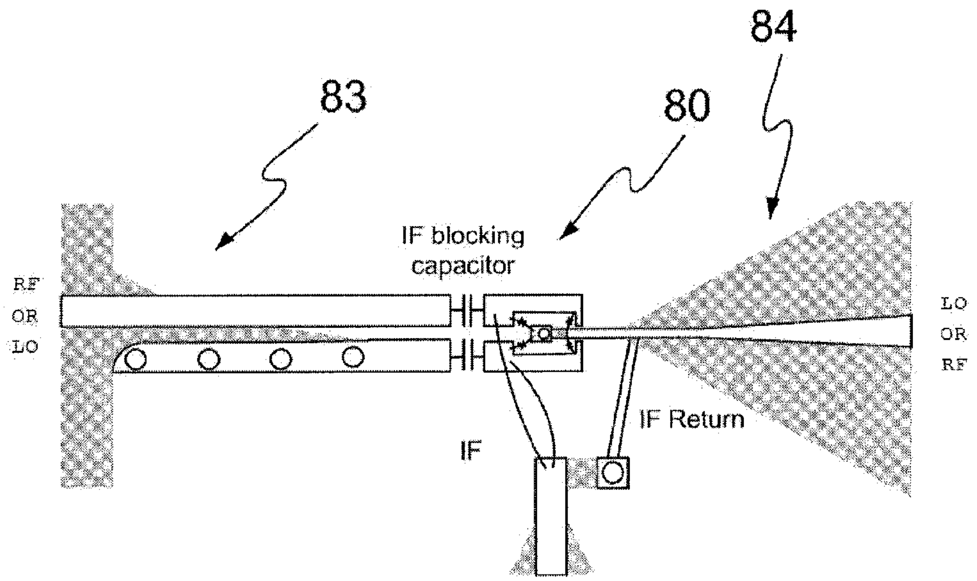
Figure 27:
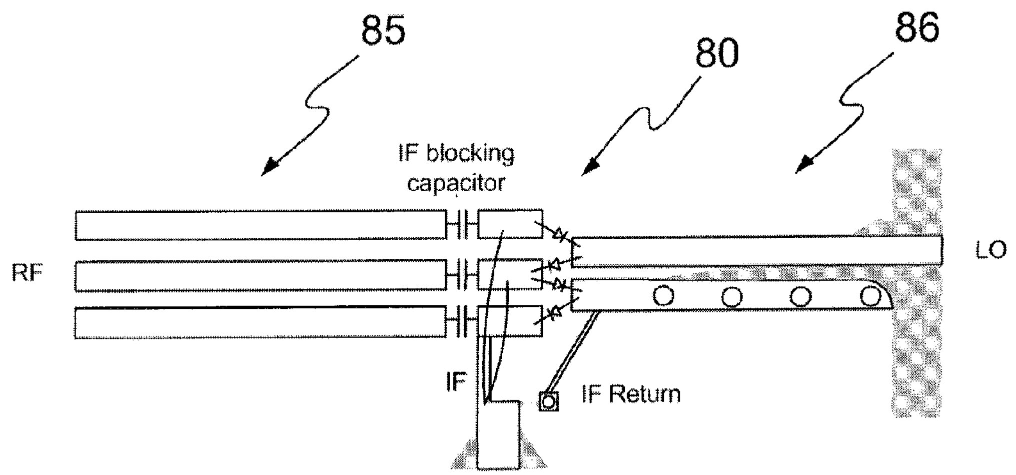

As shown in FIG. 22, baluns 81 and 82 according to the present invention are used for two ports RF and LO, and thus can be used to constitute a double-balanced mixer module. Further, as shown in FIG. 23, a double-balanced mixer module can be constructed in such a way that an ultra-wideband balun 83 according to the present invention is used for an RF or LO port while a both-sided parallel plate stripline balun 84 is used for an LO or RF port, and a signal line formed on the bottom surface of a substrate extends to the top of the substrate through a via for more convenient mount of diodes. Further, as shown in FIG. 24, a double-balanced mixer module can be constructed in such a way that an ultra-wideband balun 86 according to the present invention is used for an LO port, and a Coplanar Waveguide (CPW) line 85 is used for an RF port. FIGS. 25 to 27 are diagrams respectively showing embodiments in which the double-balanced mixer modules of FIGS. 22 to 24 are actually implemented.

The performance of the above-described double-balanced mixer modules is generally determined by a balun. Since each of the double-balanced mixer modules according to the present invention uses a balun operating in an ultra-wide band, a double-balanced mixer that operates in a very wide frequency band and has excellent characteristics from the standpoint of the conversion loss and RF-LO isolation of a mixer can be provided. Meanwhile, in the conventional mixer module using parallel-plate stripline baluns for RF and LO port inputs, a hole pocket must be formed in a substrate, and the ports of the diodes must be connected to the top and bottom surfaces of the substrates in order to mount diodes. However, as shown in FIGS. 25 to 27, when the balun of the present invention is used, diodes and capacitors can be mounted on the top surface of a substrate, so that the manufacture of the mixer can be greatly simplified, and thus manufacturing costs can be reduced.

Figure 28:
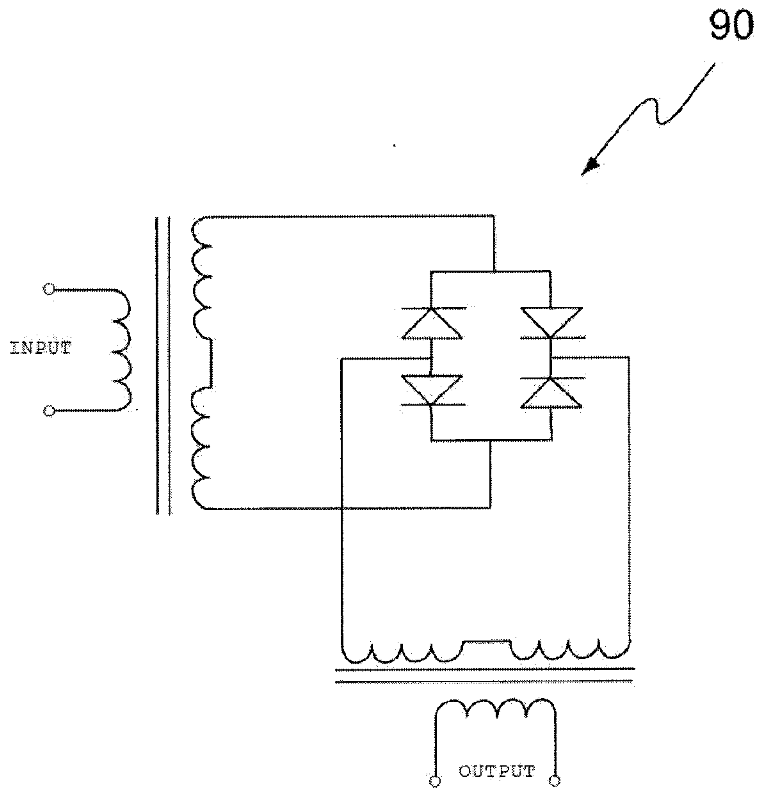
FIGS. 28 to 31 are diagrams showing examples of an ultra-wideband double-balanced multiplier module in which the ultra-wideband balun of the present invention can be used.

FIGS. 28 to 31 are diagrams showing examples of an ultra-wideband double-balanced multiplier module in which the ultra-wideband balun of the present invention can be used. As shown in FIG. 28, such a double-balanced multiplier has the same construction as the double-balanced mixer of FIG. 21, except for the array of diodes.

Figure 29:
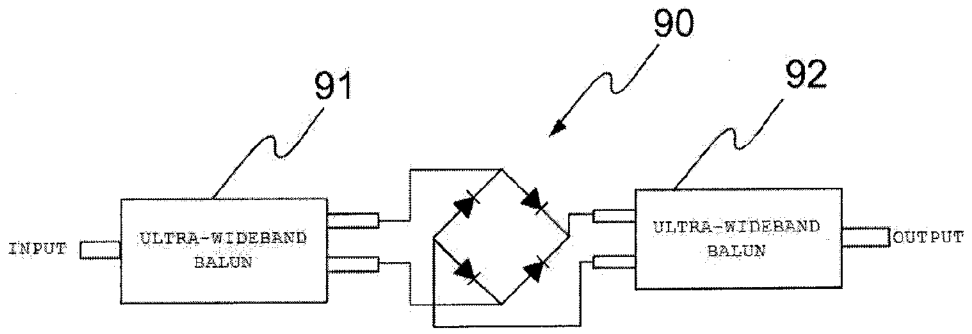
Figure 30:
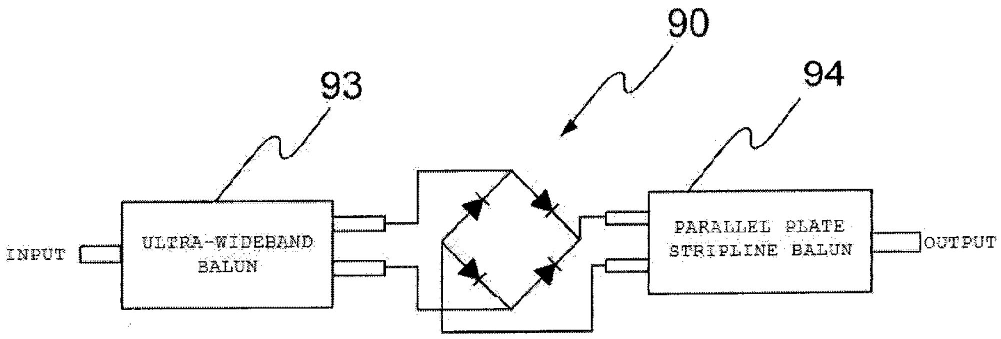
Figure 31:
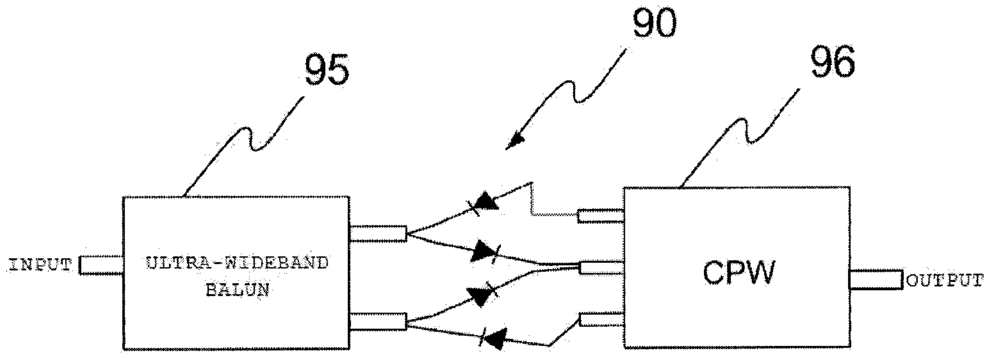

FIG. 29 is a diagram showing the case where the ultra-wideband baluns 91 and 92 of the present invention are used for the input and output ports of a double-balanced multiplier 90. FIG. 30 is a diagram showing the case where the ultra-wideband balun 93 of the present invention is used for the input port of a double-balanced multiplier 90, and a both-sided parallel-plate stripline balun 94 is used for the output port of the double-balanced multiplier 90. Further, FIG. 31 is a diagram showing the construction in which the ultra-wideband balun 95 of the present invention is used for the input port of the double-balanced multiplier 90, and a CPW line 96 is used for the output port of the double-balanced multiplier 90.

The performance of the double-balanced multiplier module having the above construction is also determined by the balun. Similar to the above-described double-balanced mixer module, when the ultra-wideband balun of the present invention is used, there is an advantage in that a double-balanced multiplier module capable of obtaining excellent conversion loss in an ultra-wide operating frequency band can be provided, in addition to an advantage in that the manufacture of the double-balanced multiplier module can be greatly simplified because diodes can be mounted in a single plane.

Figure 32:
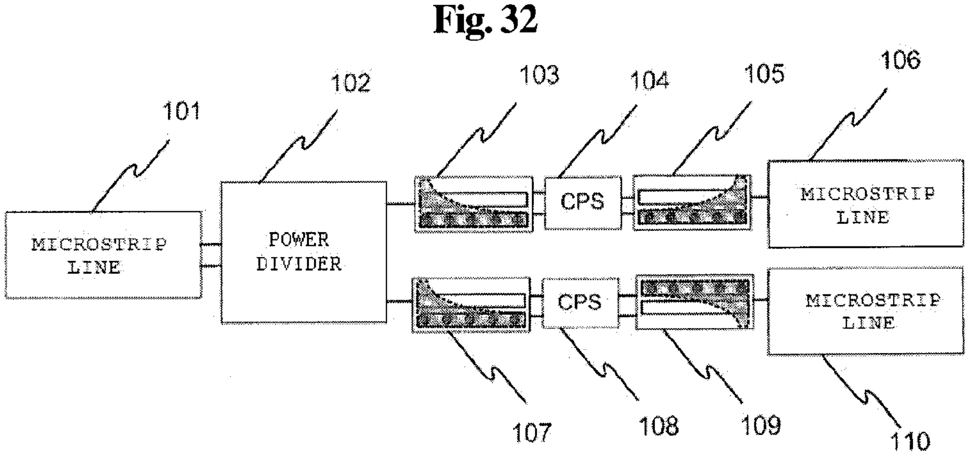
FIGS. 32 and 33 are diagrams showing examples of an ultra-wideband RF/microwave signal inverter module in which the ultra-wideband balun of the present invention can be used.
Figure 33:
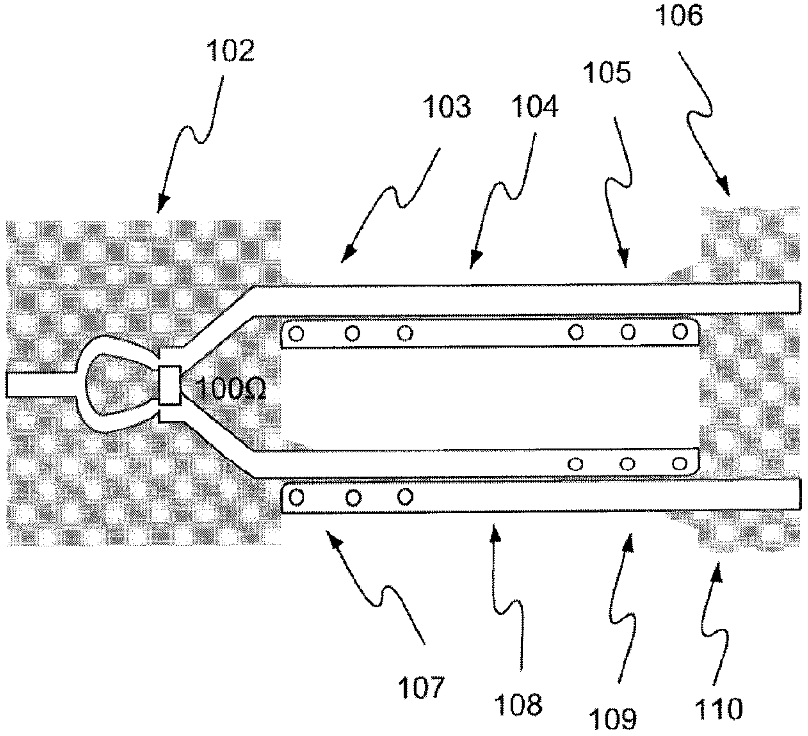

FIGS. 32 and 33 are diagrams showing examples of an RF/microwave signal inverter module in which the ultra-wideband balun of the present invention can be used.

The ultra-wideband signal inverter has a structure in which two output ports generate signals having a phase difference of 180° therebetween with a respective input RF/microwave signal. Therefore, as shown in FIG. 32, the RF/microwave signal from a single microstrip line 101 is divided into two signals using a wideband power divider 102, and the ultra-wideband baluns 103 and 107 of the present invention are applied to respective signal paths, so that a transition from the microstrip line 101 to CPS lines 104 and 108 is made. Thereafter, when, during a subsequent procedure for making a transition from the CPS lines to microstrip lines 106 and 110, the locations of parallel lines in the ultra-wideband baluns of the present invention are arranged in opposite directions in two signal paths, as shown by the reference numerals 105 and 109, signals having a phase difference of 180° in a wide band can be obtained from the output ports.

FIG. 33 illustrates an ultra-wideband signal inverter module actually implemented using a Wilkinson power divider 102 to divide a signal at an input port. Of course, in order to obtain performance covering a wider band, several stages of Wilkinson power dividers may be used, or other types of wideband power dividers may be used.

In the case of an RF/microwave signal inverter module using the ultra-wideband balun of the present invention, output signals having a phase difference of 180° between two output ports can be easily obtained in a wide band depending on the characteristics of the ultra-wideband balun of the present invention, and an RF/microwave signal inverter having excellent insertion loss characteristics can be provided.

Although the preferred embodiments of the present invention have been disclosed for illustrative purposes, those skilled in the art will appreciate that the embodiments are only examples, and are not intended to limit the present invention, and that various modifications and applications are possible, without departing from the scope and spirit of the invention. Such modifications and applications should be interpreted as being included in the scope of the present invention, which is defined by the accompanying claims.

According to the ultra-wideband balun of the present invention, an optimal balun can be designed without being limited by the dielectric constants of various substrates. That is, the function of a balun, as well as the function of an impedance converter, can be implemented through optimal impedance matching and the smooth transition of electric field distributions between an unbalanced line and a balanced line. From simulation results, it can be seen that the ultra-wideband balun of the present invention exhibits low loss characteristics in a pass band while exhibiting ultra-wideband characteristics, covering about 100 GHz (refer to FIGS. 15 and 16).

Further, an ultra-wideband planar antenna module using the ultra-wideband balun of the present invention is advantageous in that, since the operating frequency band of the balun according to the present invention is much wider than that of most planar antennas, the frequency band of an antenna is not influenced by a feeding balun, but is determined by the frequency band of the antenna element itself, thus making it possible to implement an ultra-wideband planar antenna and greatly simplifying the design process of antennas.

Further, an ultra-wideband double-balanced mixer module using the ultra-wideband balun of the present invention is advantageous in that, when the balun of the present invention is used, diodes and capacitors can be mounted in a single plane, unlike a mixer using a conventional balun, thus reducing manufacturing costs. Further, an ultra-wideband double-balanced mixer module using the ultra-wideband balun of the present invention is advantageous in that it operates in an ultra-wide band and has excellent characteristics from the standpoint of mixer conversion loss and RF-LO isolation.

Furthermore, an ultra-wideband double-balanced multiplier module using the ultra-wideband balun of the present invention is advantageous in that, since diodes are mounted in a single plane, the manufacture of the multiplier can be greatly simplified, and excellent conversion loss characteristics can be obtained in an ultra-wide band corresponding to the operating frequency.

In addition, an RF/microwave signal inverter module using the ultra-wideband balun of the present invention is advantageous in that, since two ultra-wideband baluns of the present invention are successively connected and are arranged as the directions of two parallel lines are opposite in the two signal paths, two signals having a phase difference of 180° can be easily obtained as output signals, and excellent insertion loss characteristics can be exhibited in a very wide band.

The invention claimed is:

1. An ultra-wideband balun connected between an unbalanced line and a balanced line, comprising:

a first transmission line formed on a first surface of a substrate, and configured such that a first end of the first transmission line is connected to a transmission line of the unbalanced line and a second end thereof is connected to a first one of transmission lines of the balanced line;

a second transmission line formed on the first surface of the substrate, and configured such that the second transmission line extends from a first end of the unbalanced line, is arranged alongside of the first transmission line to be spaced apart therefrom by a certain distance, and is connected to a second one of the transmission lines of the balanced line; and a ground plane formed on a second surface of the substrate and configured such that the ground plane extends from a first end of the balanced line, is formed along the second transmission line, and is connected to a ground plane of the unbalanced line, wherein the second transmission line is connected to the ground plane of the balun through one or more vias that are perpendicular to the ground plane of the balun, and the ground plane of the balun is formed such that a width of a portion thereof adjacent to the unbalanced line is greater than that of a portion thereof adjacent to the balanced line.

2. The ultra-wideband balun according to claim 1 wherein the ground plane of the balun is formed to have a shape in which a width of the ground plane decreases toward the second transmission line in a direction from the unbalanced line to the balanced line in order to make a smooth transition of electric field distributions between the unbalanced line and the balanced line.

3. The ultra-wideband balun according to claim 2, wherein the ground plane of the balun is formed to have a taper shape in which the width of the portion thereof adjacent to the unbalanced line is greater than that of the portion thereof adjacent to the balanced line.

4. The ultra-wideband balun according to claim 1, wherein the ground plane of the balun is formed to have a shape required in order to realize impedance matching between the unbalanced line and the balanced line.

5. The ultra-wideband balun according to claim 4, wherein the ground plane of the balun is formed such that variation in impedance of the balun conforms to a shape of a Klopfenstein taper.

6. An ultra-wideband antenna module, wherein the ultra-wideband balun according to claim 1 is used as a feeding line and the balanced line is a part of an antenna element requiring an input of a balanced signal.

7. A double-balanced mixer module, wherein the balanced line connected to the balun according to claim 1 is connected to an input port or an output port of a double-balanced mixer.

8. An ultra-wideband double-balanced multiplier module, wherein the balanced line connected to the balun according to claim 1 is connected to an input port or an output port of a double-balanced multiplier.

9. An ultra-wideband signal inverter module, wherein two or more baluns each according to claim 1 are arranged to be connected through a balanced line therebetween.

10. An ultra-wideband balun structure, comprising:

a microstrip line including a first transmission line and a first ground plane on both surfaces of a substrate, respectively;

a balun including:

a second transmission line which extends from a first end of the microstrip line, wherein the first transmission line continuously extends from the microstrip line on a first surface of the substrate on which the first transmission line of the microstrip line is formed, and wherein the second transmission line is arranged alongside of the first transmission line to be spaced apart therefrom by a certain distance; and and a second ground plane which extends from the first end of the microstrip line and is arranged along the second transmission line, wherein the second ground plane is formed on a second surface of the substrate on which the first ground plane is formed; and a Coplanar Strip (CPS) line formed in such a way that the first and second transmission lines of the balun continuously extend from the balun, wherein the second transmission line formed in the balun is connected to the second ground plane through one or more vias that are perpendicular to the second ground plane, and the second ground plane is formed in a taper shape in which a width of a portion thereof adjacent to the microstrip line is greater than that of a portion thereof adjacent to the CPS line.

* * * * *